United States Patent
Choi

(10) Patent No.: US 7,723,716 B2
(45) Date of Patent: May 25, 2010

(54) PHASE CHANGE MEMORY DEVICE

(75) Inventor: Kee Joon Choi, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 553 days.

(21) Appl. No.: 11/646,968

(22) Filed: Dec. 27, 2006

(65) Prior Publication Data

US 2007/0164266 A1 Jul. 19, 2007

(30) Foreign Application Priority Data

Dec. 29, 2005 (KR) .................... 10-2005-0134198

(51) Int. Cl.
*H01L 47/00* (2006.01)
*G11C 11/00* (2006.01)

(52) U.S. Cl. .......................... 257/4; 365/148
(58) Field of Classification Search .............. 257/4, 257/536, 209, 246, E45.02; 438/900; 365/148, 365/129, 163
See application file for complete search history.

(56) References Cited

U.S. PATENT DOCUMENTS

| 6,087,674 | A * | 7/2000 | Ovshinsky et al. ............. 257/2 |
| 6,566,700 | B2 | 5/2003 | Xu |
| 6,869,841 | B2 | 3/2005 | Xu |
| 2003/0067013 | A1 * | 4/2003 | Ichihara et al. ............. 257/200 |
| 2003/0073295 | A1 | 4/2003 | Xu |
| 2003/0164515 | A1 | 9/2003 | Xu |
| 2004/0195604 | A1 * | 10/2004 | Hwang et al. ............... 257/295 |
| 2005/0018526 | A1 * | 1/2005 | Lee ............................. 365/232 |
| 2006/0208847 | A1 * | 9/2006 | Lankhorst et al. ............. 338/9 |
| 2006/0286709 | A1 * | 12/2006 | Lung et al. .................. 438/102 |

FOREIGN PATENT DOCUMENTS

CN 1610950 A 4/2005

OTHER PUBLICATIONS

Partial Chinese Office Action dated Oct. 17, 2008; Chinese Patent Application No. 2006101701860; The State Intellectual Property Office of P.R.C., People's Republic of China.
Daniel Xu; "Carbon-Containing Interfacial Layer for Phase-Change Memory"; esp@cenet; Chinese Publication No. CN1610950 A; Publication Date: April 27, 2005; esp@cenet Database—Worldwide, http://v3.espacenet.com/publicationDetails/biblio?KC=A &date=20050427&NR=1610950 . . . .

* cited by examiner

*Primary Examiner*—Thomas L Dickey
*Assistant Examiner*—Nikolay Yushin
(74) *Attorney, Agent, or Firm*—The Law Offices of Andrew D. Fortney; Andrew D. Fortney

(57) ABSTRACT

There is provided a semiconductor device. The semiconductor device includes a lower electrode, a contact connected to the lower electrode to have a double trench structure, a phase change material layer accommodated in the double trench to cause a phase change between a crystalline state and an amorphous state in accordance with a change in heat transmitted by the contact, and an upper electrode connected to the phase change material layer.

20 Claims, 4 Drawing Sheets

PHASE CHANGE MEMORY DEVICE

BACKGROUND OF THE INVENTION

1. Field of the Invention

The present invention relates to a semiconductor device and a method of manufacturing the same.

2. Description of the Related Art

A phase change memory is a memory that uses a difference in resistance between materials in accordance with a phase change and is one of next generation memory semiconductors that has the advantage of a flash memory in which stored information is not erased although power is not supplied and the advantage of a dynamic random access memory (DRAM) in which stored data is erased when power is not supplied, however, processing speed is high.

The phase change memory has an access time at least 1,000 times faster than that of the flash memory that is a representative non-volatile memory and can operate at a low voltage of no more than 2 to 5 V like the DRAM.

Also, it is possible to read and write data fast in the phase change memory like in a static random access memory (SRAM). Since the phase change memory has a relatively simple cell structure, it is possible to reduce the size of a device to the size of a DRAM device.

Also, since not a memory device using storage of charges but a difference in resistance between materials in accordance with a phase change is used, it is possible to write down and erase information no less than $10^{10}$ times without being affected by cosmic radiation or electromagnetic wave.

FIG. 1 is a sectional view illustrating the structure of a conventional phase change memory.

As illustrated in FIG. 1, a phase change memory 10 includes a lower electrode 12, a contact 14, a phase change material layer 16, and an upper electrode 18.

The temperature of the phase change material layer 16 is changed by the amount of current that flows in the contact 14. In accordance with the change in temperature, the alignment of the atoms or molecules of the phase change material layer 16 is changed into an amorphous state having no regularity or a crystalline state having regularity to obtain 1 and 0 through the lower electrode 12 and the upper electrode 18. The signal is 0 when the alignment is in the crystalline state and is 1 when the alignment is in the amorphous state. Information is processed while repeating the states.

As illustrated in FIG. 1, in the conventional phase change memory 10, since the contact 14 is connected to the phase change material layer 16 only through the top surface thereof, the heat generated by the contact resistance of the contact 14 is transmitted to the phase change material layer 16 based on the top surface of the contact 14 in the radiation direction (the arrow of FIG. 1).

Therefore, a program region 15 that functions as a memory is limited to a partial region as illustrated in FIG. 1, the amount of generation of heat is determined by the area of the top of the contact, the distribution of heat is not uniform all over the phase change material layer 16, and heat transmission time is long.

When heat distribution is not uniform and it takes a long time to transmit heat like the conventional phase change memory 10, a switching time for which the phase change material layer 16 changes from an amorphous state to a crystalline state or from the crystalline state to the amorphous state increases so that the operation speed of a memory becomes low.

SUMMARY OF THE INVENTION

The present invention has been made to solve the above problem occurring in the prior art, and therefore, it is an object of the present invention to provide a semiconductor device in which the heat generated by contact resistance is uniformly transmitted to a phase change material layer at high speed so that operation speed increases and a method of manufacturing the same.

It is another object of the present invention to provide a semiconductor device capable of improving the heat transmission efficiency of a contact and a method of manufacturing the same.

In order to achieve the above objects, a semiconductor device includes a lower electrode, a contact connected to the lower electrode to have a double trench structure, a phase change material layer accommodated in the double trench to cause a phase change between a crystalline state and an amorphous state in accordance with a change in heat transmitted by the contact, and an upper electrode connected to the phase change material layer.

A method of manufacturing a semiconductor device includes the steps of forming a first protective layer on a lower electrode, selectively etching the first protective layer to form a double trench, applying a contact layer to fill the double trench and polishing the contact layer so that the contact layer is left only in the double trench, partially etching the polished contact layer to form a second trench, applying a phase change material to fill the second trench and polishing the phase change material so that the phase change material is left only in the second trench to form a phase change material layer, and forming an upper metal layer connected to the phase change material.

DETAILED DESCRIPTION OF THE INVENTION

Embodiments of the present invention will be described with reference to the attached drawings.

Figure 1:
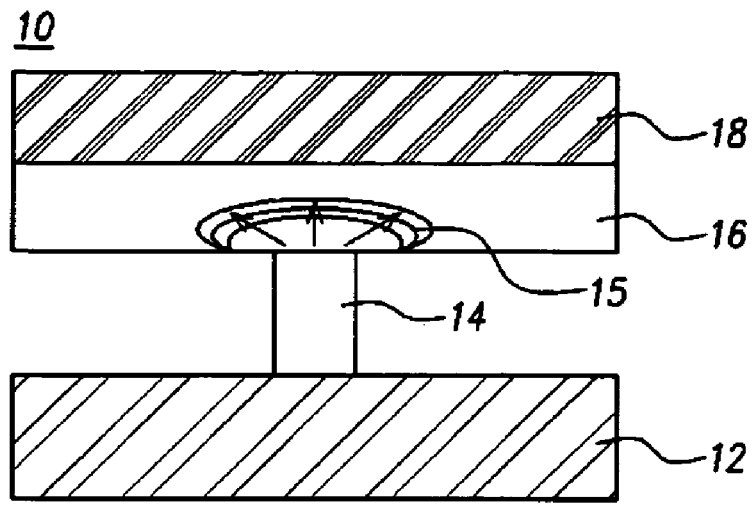
FIG. 1 is a sectional view illustrating the structure of a conventional phase change memory.
Figure 2A:
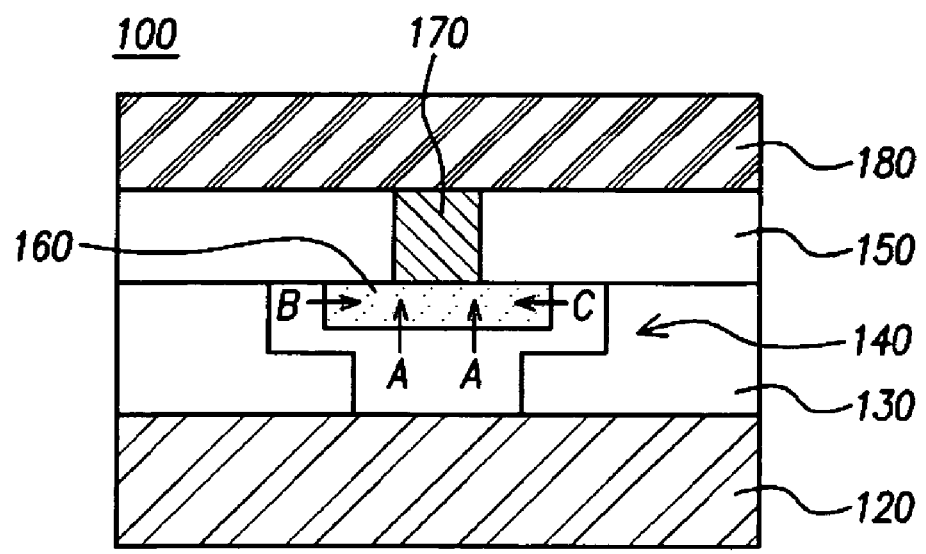
FIGS. 2A and 2B are a sectional view and a plan view illustrating the structure of a phase change memory according to the present invention.
Figure 2B:
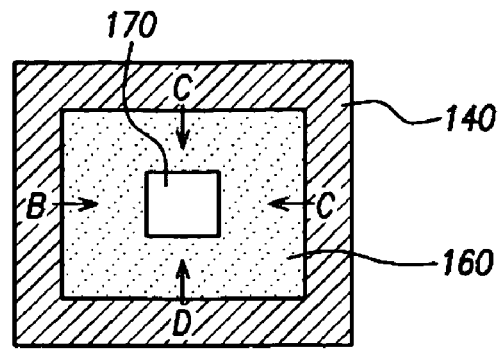

FIGS. 2A and 2B are a sectional view and a plan view illustrating the structure of a phase change memory according to the present invention.

As illustrated in FIGS. 2A and 2B, a phase change memory 100 according to the present invention includes a lower electrode 120, a contact 140, a phase change material layer 160, a connection via 170, and an upper electrode 180.

The contact 140 is a double trench in which a double step difference is formed in a first protective layer 130 unlike the contact 14 of the conventional phase change memory 10. Also, the phase change material layer 160 is accommodated in the double trench of the contact 140.

That is, the phase change material layer 160 contacts the four side surfaces of the contact as illustrated in the plan view of FIG. 2B and contacts the top surface of the contact as illustrated in the sectional view of FIG. 2A. Therefore, the heat generated by the contact 140 is transmitted to the phase change material layer 160 through the top surface of the contact 140 (refer to the arrow A of FIG. 2A) and is transmitted to the phase change material layer 160 through the four side surfaces of the contact 140 (refer to the arrows B, C, D, and E of FIG. 2B). As described above, since the heat of the contact 140 is transmitted to the phase change material layer 160 through the five surfaces in the phase change memory 100, the heat generated due to the contact resistance is uniformly and fast transmitted to the phase change material layer 160.

In the phase change memory 100, the connection via 170 is formed in the second protective layer 160 to connect the phase change material layer 160 and the upper electrode 180 to each other.

The lower electrode 120 and the upper electrode 180 can be made of an alloy of Ti, Ni, W, Cu, and N and polycrystalline silicon. The first protective layer 130 and a second protective layer 150 are, for example, ZnS—SiO$_2$. The contact 140 is formed of an electric conductive material having high heat transmission and no less than a predetermined value of sheet resistance.

The phase change material 160 is formed of a Chalcogenide material thin film such as Ge—Sb—Te based nucleation dominant material (NDM) (for example, Ge$_2$Sb$_2$Te$_5$) and Sb$_{70}$Te$_{30}$ based fast growth material (FGM).

For the phase change material layer 160 to store information in an amorphous state, heat is electrically applied or light is radiated to the phase change material layer 160 and the phase change material layer 160 is rapidly cooled. For the phase change material layer 160 to erase the stored information in a crystalline state, heat of temperature slightly higher than crystal temperature must be applied for a predetermined time required for causing a phase change.

In general, the temperature of the GeSbTe phase change material is about 600° C. when information is stored and is about no less than 179° C. when information is erased. When the phase change material layer 160 is in the crystalline state, electric resistance is small so that current can flow. However, when the phase change material layer 160 is cooled after the heat caused by the contact resistance with respect to the contact 140 is applied, the phase change material layer 160 is in the amorphous state, resistance increases so that current is intercepted.

The method of manufacturing the phase change memory 100 according to the present invention will be described with reference to FIGS. 3 to 8.

Figure 3:
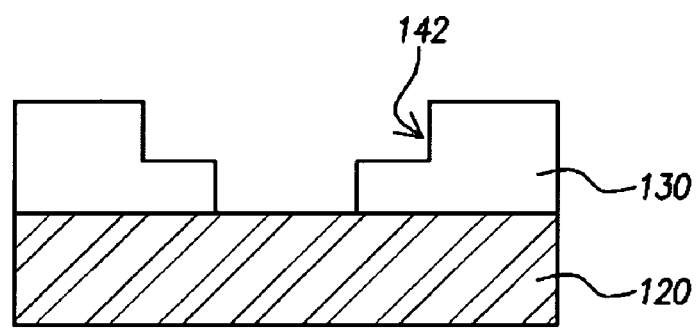
FIG. 3 is a sectional view illustrating the step of forming a double trench in a lower electrode in processes of manufacturing a phase change memory according to the present invention.

Referring to FIG. 3, the first protective layer 130 is applied on the lower electrode 120 to form a double trench 142. Polycrystalline silicon or metal is applied on a substrate (not shown) by a chemical vapor deposition (CVD) method to form the lower electrode 120. When the lower electrode 120 is formed by the polycrystalline silicon, an ion implantation process for controlling the electric resistance must be performed. The double trench 142 can be formed by performing a photolithography process twice or a dual damascene process.

Figure 4:
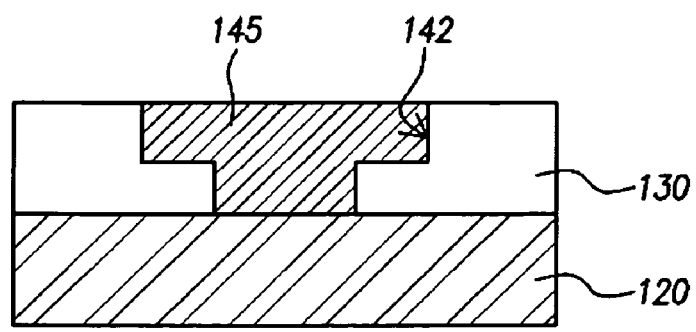
FIG. 4 is a sectional view illustrating a state where a contact layer fills the double trench in the processes of manufacturing the phase change memory according to the present invention.

Referring to FIG. 4, a contact layer 145 is applied to fill the double trench 142 and is polished so that the contact layer 145 exists only in the double trench 142 and that the top surface of the contact layer 145 coincides with the top surface of the first protective layer 130. In the polishing process, a chemical mechanical polishing (CMP) method can be used.

Figure 5:
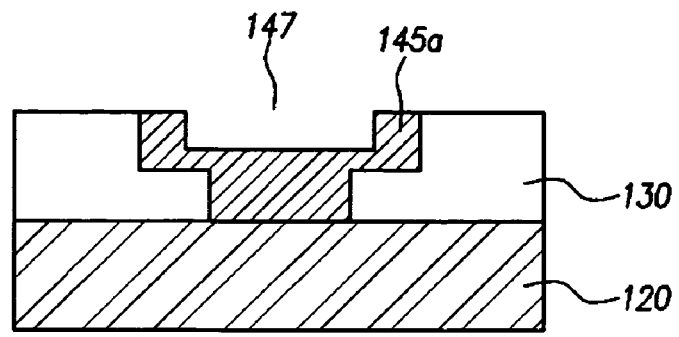
FIG. 5 is a sectional view illustrating the step of forming a second trench in the contact layer in the processes of manufacturing the phase change memory according to the present invention.

Then, as illustrated in FIG. 5, the contact layer is selectively etched by a photolithography process to form a contact layer pattern 145a having a second trench 147. The second trench 147 is positioned in the center of the double trench 142 of the contact.

Figure 6:
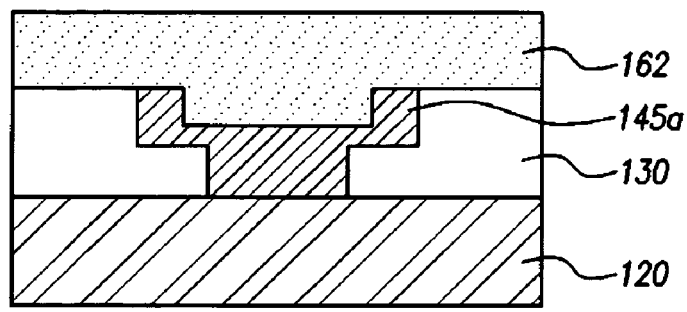
FIG. 6 is a sectional view illustrating a state where a phase change material layer is applied in the processes of manufacturing the phase change memory according to the present invention.
Figure 7:
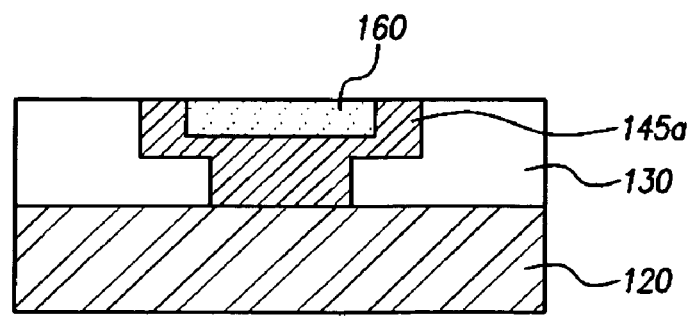
FIG. 7 is a sectional view illustrating the step of planarizing a phase change material layer so that the phase change material layer is left only in a second trench in the processes of manufacturing the phase change memory according to the present invention.

Referring to FIG. 6, a phase change material 162 is applied to fill the second trench 147 of the contact layer pattern 145a. As illustrated in FIG. 7, the phase change material 162 is planarized by the CMP process so that the phase change material is left only in the second trench 147 to form the phase change material layer 160. As illustrated in FIGS. 6 and 7, the second trench 147 contacts all of the surfaces of the phase change material layer excluding the surface on which the phase change material layer 160 is connected to the upper electrode or the connection via 170.

Figure 8:
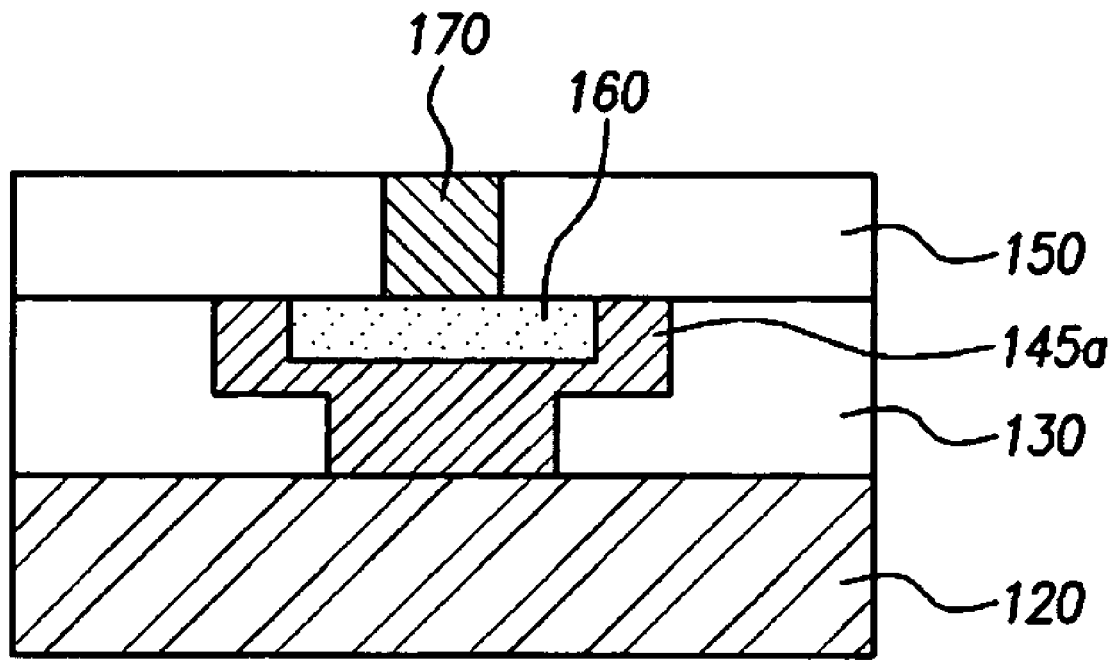
FIG. 8 is a sectional view illustrating the step of applying a second protective layer and of forming a via in the processes of manufacturing the phase change memory according to the present invention.

Then, as illustrated in FIG. 8, the second protective layer 150 is applied and a hole is formed to open the phase change material layer 160 so that the hole is filled with electric conductor to form the connection via 170. Then, when an upper metal layer 180 connected to the phase change material layer 160 is formed through the connection via 170, the phase change memory 100 illustrated in FIG. 2A is completed.

In the phase change memory according to the present invention, since the phase change material layer contacts the contact on the four side surfaces and contacts the top surface of the contact, the heat generated by the contact is uniformly and fast transmitted to the entire phase change material layer.

Also, in the phase change memory according to the present invention, heat distribution is uniform and heat is transmitted fast so that the switching time for which the phase change material layer changes from the amorphous state to the crystalline state and from the crystalline state to the amorphous state is reduced and that the operation speed of the memory increases.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A semiconductor device comprising:
   a lower electrode;
   a contact comprising a lower portion and an upper portion thereon, the upper portion having substantially vertical sidewalls and a width greater than that of the lower portion, the lower portion having substantially vertical sidewalls and being connected to the lower electrode;
   a phase change material layer in the upper portion of the contact, the phase change material layer having substantially vertical sidewalls, a substantially horizontal lowermost surface, and an area smaller than that of the upper portion of the contact; and an upper electrode connected to the phase change material layer.

2. The semiconductor device of claim 1, wherein the contact is in a dual damascene trench and via.

3. The semiconductor device of claim 2, wherein the phase change material layer is in the dual damascene trench.

4. The semiconductor device of claim 1, wherein the phase change material layer includes a material comprising Ge, Sb, and Te.

5. The semiconductor device of claim 4, wherein the phase change material layer includes a Ge—Sb—Te based nucleation dominant material (NDM).

6. The semiconductor device of claim 1, wherein the phase change material layer includes a material comprising Sb and Te in a molar ratio of 1:1 or greater.

7. The semiconductor device of claim 6, wherein the phase change material layer includes a material comprising Sb and Te in a molar ratio of 2:1 or greater.

8. The semiconductor device of claim 6, wherein the phase change material layer includes a $Sb_{70}Te_{30}$ based fast growth material (FGM).

9. The semiconductor device of claim 1, wherein the phase change material undergoes a phase change between a crystalline state and an amorphous state in accordance with a change in heat transmitted by the contact.

10. The semiconductor device of claim 1, wherein the phase change material layer includes four sidewalls surrounded by the upper portion of the contact.

11. The semiconductor device of claim 10, wherein the contact transmits heat to the phase change material layer through the four sidewalls of the phase change material layer.

12. The semiconductor device of claim 1, wherein the contact transmits heat to the phase change material layer through the substantially horizontal surface of the phase change material layer.

13. The semiconductor device of claim 1, wherein the lower electrode comprises Ti, Ni, W, Cu, N, or polycrystalline silicon.

14. The semiconductor device of claim 13, wherein the upper electrode comprises Ti, Ni, W, Cu, N, or polycrystalline silicon.

15. The semiconductor device of claim 1, wherein the contact comprises an electrically conductive material.

16. The semiconductor device of claim 1, further comprising a first protective layer on the lower electrode, wherein the contact is in the first protective layer.

17. The semiconductor device of claim 16, further comprising a second protective layer on the first protective layer, and a via in the second protective layer.

18. The semiconductor device of claim 17, wherein the via is in electrical contact with the phase change material layer.

19. The semiconductor device of claim 17, wherein the via comprises a metal layer.

20. The semiconductor device of claim 17, wherein the upper electrode is electrically connected to the via.

* * * * *